US005196915A

United States Patent [19]

Ito et al.

[11] Patent Number: 5,196,915

[45] Date of Patent: Mar. 23, 1993

[54] SEMICONDUCTOR DEVICE

[75] Inventors: Osamu Ito, Gaithersburg, Md.; Tadamichi Asai, Ibaraki, Japan; Toshio Ogawa, Katsuta, Japan; Mitsuru Hasegawa, Hitachi, Japan; Akira Ikegami, Yokohama, Japan; Yoshishige Endoh, Tsuchiura, Japan; Michio Ootani, Chiba, Japan; Katsuo Ebisawa, Ibaraki, Japan

[73] Assignees: Hitachi, Ltd.; Hitachi Chemical Company, Ltd., both of Tokyo, Japan

[21] Appl. No.: 437,825

[22] Filed: Nov. 17, 1989

[30] Foreign Application Priority Data

Nov. 21, 1988 [JP] Japan ................................ 63-294019
Nov. 21, 1988 [JP] Japan ................................ 63-294020

[51] Int. Cl.$^5$ ........................ H01B 1/06; H01L 27/01; H01C 17/06

[52] U.S. Cl. ........................................ 257/379; 357/67; 252/518; 252/521; 338/333; 338/224; 257/536

[58] Field of Search .................... 357/51, 67; 252/518, 252/521; 338/333, 224

[56] References Cited

U.S. PATENT DOCUMENTS

| | | | |
|---|---|---|---|
| 3,503,801 | 11/1967 | Huang et al. | 338/308 |
| 3,924,221 | 12/1975 | Winkler | 338/208 |
| 3,943,168 | 3/1976 | Patterson | 252/426 |
| 4,512,917 | 4/1985 | Donohue | 252/521 |
| 4,657,699 | 4/1987 | Nair | 252/513 |
| 4,720,418 | 1/1988 | Kuo | 428/209 |
| 4,732,798 | 3/1988 | Ishida et al. | 428/137 |
| 4,868,537 | 9/1989 | Blanchard | 357/51 |
| 4,893,166 | 1/1990 | Geekie | 357/51 |

FOREIGN PATENT DOCUMENTS

| | | |
|---|---|---|
| 59-165447 | 9/1984 | Japan . |
| 1-103801 | 4/1989 | Japan . |

*Primary Examiner*—Eugene R. LaRoche
*Assistant Examiner*—Viet Q. Nguyen
*Attorney, Agent, or Firm*—Antonelli, Terry, Stout & Kraus

[57] ABSTRACT

In a semiconductor device such as hybrid IC, thermal heads, etc., a thick film resistor of the semiconductor device contains a boride particle of a metal dispersed in a glass matrix, the particle having a particles size of 0.005 to 0.1 μm. Generation of a thermal stress can be suppressed and the electroconductive particles themselves form isotropic electroconductive passages by such dispersion, and the semiconductor devices can have a distinguished electroconductivity. Preferable boride of a metal is $LaB_6$, which gives distinguished resistor characteristics.

44 Claims, 6 Drawing Sheets

SEMICONDUCTOR DEVICE

BACKGROUND OF THE INVENTION

This invention relates to a semiconductor device using thick film resistors, a thick film resistor composition and a process for producing electroconductive particles for the thick film resistor.

Heretofore, $RuO_2$-based materials have been used as materials for the resistors in semiconductor devices such as thick film hybrid IC, etc., and Ag-Pd-based materials have been used for conductor circuits. These materials can be fired in air, but the Ag-Pd-based materials have a relatively high impedance, which has been a bottleneck in the needs for lower impedance in the semiconductor devices.

On the other hand, Cu-based circuit conductors have a lower impedance and a higher reliability than the Ag-Pd-based materials, and thus the Cu-based materials are used in some semiconductors such as hybrid IC, etc. However, Cu is readily oxidized and thus the firing can be only carried out in a non-oxidative atmosphere, for example, a $N_2$ gas. In that case, the $RuO_2$-based materials as the resistor material are reduced to Ru in a $N_2$ gas, and consequently lose the characteristics as the resistor. Thus, in semiconductor devices having Cu-based conductor circuits, a resistor composition comprising a metal boride, such as $LaB_6$, glass powder and an organic vehicle is used as the resistor material, as disclosed in Japanese Patent Publication No. 59-51721.

However, these materials have such an inconvenience that no stable resistors having a sheet resistance of more than a few KΩ/□ are obtained. Thus, as resistors susceptible to firing in a non-oxidative atmosphere, $LaB_6$-based materials are used for a low sheet resistance (10-5 KΩ/□) and $SnO_2$-based materials are used for a high sheet resistance (10k-1 MΩ/□).

As conductor materials for semiconductor devices such as thermal heads for video copying, etc., Au is used as a conductor material and $RuO_2$-glass-based exothermic resistors thermistors are used as resistor materials, as disclosed in Japanese Patent Publication No. 53-9543. These materials can be fired in air, but Au is a noble metal and Cu has been regarded as an electroconductive material as a substitute for Au.

Cu is a base material and thus must be fired in a nonoxidative atmosphere. When Cu is used as an electroconductive material, the thermistors for the thermal heads must be such that can be fired in a nonoxidative atmosphere. As the resistors that can be fired in the nonoxidative atmosphere, resistors based on a combination of $LaB_6$ as an electroconductive component and glass are known, and it is possible to use these resistors as thermistors.

The so far proposed resistors have such a structure that $LaB_6$ is dispersed in borosilicate glass, and generate a thermal stress due to the combination of different materials, when used as a thermistor for the thermal head, resulting in such inconveniences that a higher voltage is applied to the resistor and the change in the resistivity with time is increased.

SUMMARY OF THE INVENTION

One object of the present invention is to provide a thick film resistor composition capable of suppressing the generation of a thermal stress due to the combination of different materials and having a distinguished heat resistance, and a semiconductor device such as a thermal head, etc. using the composition.

In the prior art metal boride powder is finely pulverized by mechanical pulverization using a grinding mill, a centrifugal ball mill, a vibrating mill, etc. When the metal boride powder is finely pulverized by the mechanical pulverization, the resulting particles have a more rugged shape and the electroconductive particles themselves fail to form isotropic electroconductive paths. A thick film resistor formed from these particles thus has such inconveniences that a fluctuation in the resistivity and noises are readily generated.

Another object of the present invention is to provide a thick film resistor composition capable of forming isotropic electroconductive paths from electroconductive particles themselves, a semiconductor device having thick film resistors made from the composition, and a process for forming electroconductive particles for a thick film resistor.

In order to improve the heat resistance of an exothermic resistor, the present invention provides a thick film resistor composition which comprises at least one metal boride selected from compounds of elements belonging to Groups IV, V, VI, VII and VIII and the rare earth elements of the periodic table, preferably Ti, W, Mn and Co, more preferably La, and boron; glass powder capable of being fired in a non-oxidative atmosphere without any reduction by the metal boride and having a substantial composition of 30–50 wt. % $SiO_2$, 5–40 wt. % $B_2O_3$, 5–30 wt. % CaO and 5–20 wt. % $Al_2O_3$, preferably 40–47 wt. % $SiO_2$,25–35 wt. % $B_2O_3$, 10–20 wt. % CaO and 7–15 wt. % $Al_2O_3$, and at least one oxide selected from $ZrO_2$, $HfO_2$, $Y_2O_3$, $La_2O_3$ and $ThO_2$ as a first aspect of the present thick film resistor composition.

In the first aspect of the present thick film resistor composition, the present invention further provides a thick film resistor composition, wherein 1 to 40 parts by weight of the oxide is contained per 100 parts by weight of sum total of the metal boride and the glass powder, as a second aspect of the present thick film resistor composition.

In the first or second aspect of the present thick film resistor composition, the present invention further provides a thick film resistor composition, wherein the metal boride is $LaB_6$ and the oxide is $ZrO_2$, as a third aspect of the present thick film resistor composition.

In any of the first to third aspects of the present thick film resistor compositions, the present invention further provides a thick film resistor composition, wherein an organic vehicle is added to the mixture of the metal boride, the glass powder and the oxide, as a fourth aspect of the present thick film resistor composition.

The present invention further provides a thermal head using a fired product of any of the first to fourth aspects of the present thick film resistor compositions as a thermistor.

The present invention further provides a thick film resistor composition which comprises a mixture of ultra fine $LaB_6$ particles coagulated (solidified) from the vapor phase as an electroconductive material and glass powder in an organic vehicle, the mixture being able to be fired in a non-oxidative atmosphere, as a fifth aspect of the present thick film resistor composition.

In the fifth aspect of the present thick film resistor composition, the present invention further provides a thick film resistor composition, wherein the ultra fine $LaB_6$ particles have a particle size of 0.005 to 0.1 μm and a specific surface area of 25 $m^2/g$ or more, preferably 35 $m^2/g$ or more, as a sixth aspect of the present thick film resistor composition.

In the fifth or sixth thick film resistor composition, the present invention further provides a thick film resistor composition, wherein the ultra fine $LaB_6$ particles have a substantially spherical shape, as a seventh aspect of the present thick film resistor composition.

In the fifth, sixth or seventh thick film resistor composition, the present invention further provides a thick film resistor composition, wherein the ultra fine $LaB_6$ particles are the particles solidified from the vapor phase by exposing the particles to a heat energy from a plasma heat source, as an eighth aspect of the present thick film resistor composition.

The present invention further provides a thick film resistor having a temperature coefficient of resistivity (TCR) within a range of ±300 ppm/°C., made from the sixth aspect of the present thick film resistor composition.

The present invention further provides a semiconductor device such as a thick film hybrid IC, etc., using a thick film resistor made from any of the fifth to eighth aspects of the present thick film resistor compositions.

The present invention further provides a process for producing electroconductive particles for a thick film resistor, which comprises exposing $LaB_6$ particles to a thermal energy from a plasma heat source, thereby evaporating the $LaB_6$ particles, and quenching the evaporated $LaB_6$ particles, thereby forming ultra fine $LaB_6$ particles having a particle size of not more than 0.1 μm, preferably 0.005 to 0.1 μm.

$ZrO_2$, $HfO_2$, $Y_2O_3$, etc. are high melting point oxides and are used as refractory materials. Glass powder capable of being fired in a nonoxidative atmosphere without any reduction with a metal boride, for example, $SiO_2$ and CaO, can form compounds with a high melting point oxide such as $ZrO_2$, etc., and such compounds are used as refractory materials for refractory bricks, ladles for metal melting, induction type electric furnaces, etc. Furthermore, the high melting point oxides such as $ZrO_2$, etc. are thermodynamically stable materials and are never reduced even by combinations with a metal boride. Thus, even if the resistor composition containing an oxide such as $ZrO_2$, etc. is fired, the electrical characteristics of the resulting resistor are not changed.

When resistors made from a thick film resistor composition are used in a thermal head, generation of a thermal stress due to combinations of different materials is a problem at the heat generation. However, when a metal boride ($LaB_6$, $TiB_2$, $ZrB_2$ or $TaB_2$), an oxide ($ZrO_2$, $HfO_2$, $Y_2O_3$, $La_2O_3$, or $ThO_2$) and glass powder (borosilicate glass powder), each having an approximate coefficient of linear expansion, as given in the following Table 1, are used, the generation of a thermal stress can be suppressed at the heat generation. That is, a heat resistance can be given to the thermistor without impairing the reliability and duration of the exothermic resistor.

TABLE 1

| | Coefficient of linear expansion ($10^{-6}$/°C.) | Melting point (°C.) |
|---|---|---|
| $LaB_6$ | 6.4 | 2530 |
| $TiB_2$ | 4.6 | 2790 |
| $ZrB_2$ | 5.9 | 3200 |
| $TaB_2$ | 8.2 | 3037 |
| $ZrO_2$ | 7.7 | 2690 |
| $HfO_2$ | 6.5 | 2790 |
| $Y_2O_3$ | 9.3 | 2410 |
| $La_3O_3$ | 10.8 | 2300 |
| $ThO_2$ | 9.5 | 3300 |
| Borosilicate glass | 5-8 | 800-900 (Softening temp., °C.) |

Fine electroconductive particles obtained by evaporation in a plasma and successive quenching have a smooth surface and a substantially spherical shape. Such fine electroconductive particles, when used as electroconductive particles in the thick film resistor, are readily dispersed in the glass matrix, and thus the fine electroconductive particles themselves can form isotropic electroconductive passages when the fine electroconductive particles are substantially uniformly dispersed in the glass powder at the mixing, and thus the chain-like passages can be stabilized. Thus, the thick film resistor based on the fine electroconductive particles can have less fluctuations in the resistivity and a lower noise level.

As described above, the present thick film resistor composition contains an oxide besides the metal boride and glass resistor components and thus generation of a thermal stress can be suppressed at the heat generation, contributing to an increase in the heat resistance and the pulse resistance. Furthermore, Cu can be used as an electroconductive material and thus can contribute to cost reduction. Furthermore, the power applied at the heat generation can be increased and the change in the resistivity with time can be reduced. Thus, the present thick film resistor composition can contribute to an improvement of images on a heat-sensitive sheet when applied to a thermal head.

In the present invention, fine $LaB_6$ particles are formed by exposing the $LaB_6$ particles to heat energy from a plasma heat source and thus the electroconductive particles themselves can form isotropic electroconductive passages. Thus, a thick film resistor having less fluctuations in the resistivity and a lower noise level can be provided. Still furthermore, a thick film resistor having a sheet resistance of a lower to a higher value can be provided by changing the mixing ratio of fine $LaB_6$ particles to the glass powder. Still furthermore, a thick film resistor having a temperature coefficient of resistivity can be obtained by making the particle size of the fine $LaB_6$ particles not more than 0.1 μm and the specific surface area 25 $m^2/g$ or more. The present thick film resistor composition, when used as a thick film resistor in a thick film hybrid IC, can contribute to a lower current noise level.

PREFERRED EMBODIMENTS OF THE INVENTION

Figure 1:
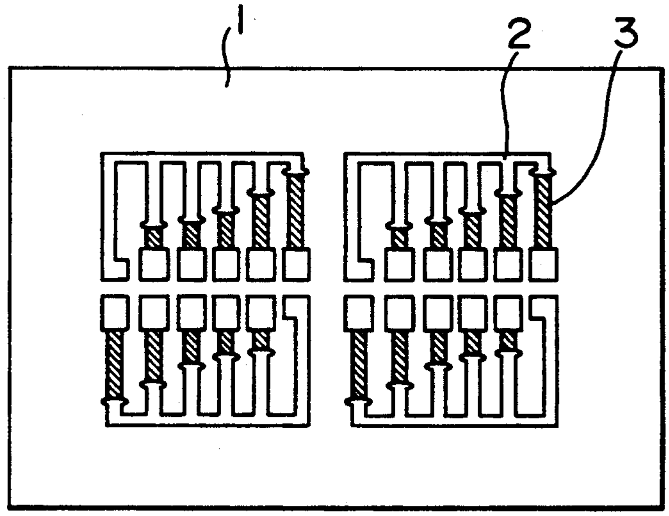
FIG. 1 shows a schematic structure of a thick film resistor according to one embodiment of the present invention.

The present invention will be described below, referring to embodiments of the present invention and drawings.

EXAMPLE 1

In order to form thick film resistors, $LaB_6$ having an average particle size of 1 μm was selected as a metal boride, borosilicate glass having an average particle size of 4 μm as glass powder and $ZrO_2$ having an average particle size of 0.5 μm as an oxide. Then, these components were mixed together according to compositions given in the following Table 2. The glass powder used had a softening point of 843° C.

A predetermined amount of an organic vehicle, which was a solution of acrylic resin in butylcarbitol acetate was added to the mixtures, followed by uniform mixing. Resistor pastes were prepared thereby.

Then, a Cu conductor paste and the thus prepared resistor paste were printed on the pattern on an alumina substrate 1 to form copper conductors 2 and thick film resistors 3, respectively.

In this manner, 9 kinds of thick film resistors 3 were formed on the individual alumina substrates 1 and various characteristics of the thick film resistors 3 were measured. The results are shown in the following Table 2.

TABLE 2

| Resistor No. | $LaB_6$ (vol. %) | Glass (vol. %) | $ZrO_2$ (parts by weight) | Sheet resistance R (Ω/□) | Temperature coefficient of resistivity (ppm/°C.) | Fluctuation in sheet resistance (σ/R) |
|---|---|---|---|---|---|---|
| 1 | 20 | 80 | 0 | 98k | −121 | 0.16 |
| 2 | 23 | 77 | 5 | 101k | −98 | 0.32 |
| 3 | 19 | 81 | 10 | 108k | −130 | 0.46 |
| 4 | 41 | 59 | 0 | 112 | −32 | 0.14 |
| 5 | 40 | 60 | 5 | 103 | −20 | 0.20 |
| 6 | 38 | 62 | 10 | 130 | −21 | 0.23 |
| 7 | 63 | 37 | 0 | 10.2 | +56 | 0.42 |
| 8 | 61 | 39 | 5 | 9.5 | +89 | 0.29 |
| 9 | 58 | 42 | 10 | 8.6 | +101 | 0.37 |

In Table 2, σ is a standard deviation, R is an average sheet resistance, and parts by weight of $ZrO_2$ is per 100 parts by weight of a mixture of $LaB_6$ and glass.

As is obvious from Table 2, there were no large differences in the resistor characteristics between the resistors containing no $ZrO_2$ (Nos. 1, 4 and 7) and those containing $ZrO_2$.

Then, an electrostatic pulse was applied to the 9 kinds of the thick film resistors 3 to measure changes in the sheet resistance and the temperature coefficient of resistivity. The results are shown in the following Tables 3 and 4. As the electrostatic pulse, a signal by which a voltage of 10 V was applied per unit sheet resistance of the respective thick film resistors 3 through a sphere gap. Measurements of the sheet resistance and the temperature coefficient of resistivity were carried out five times for each resistor, i.e. before the application of the electrostatic pulse, and after 100 applications, 1,000 applications, 5,000 applications and 10,000 applications of the electrostatic pulse.

TABLE 3

| Resistor No. | $ZrO_2$ as added | Sheet resistance (Ω/□) and change ratio of sheet resistance (%) — Number of pulse applications: 0 | 100 | 1,000 | 5,000 | 10,000 |
|---|---|---|---|---|---|---|
| 1 | 0 | 98k | 75k<br>−23% | 70k<br>−29% | 68k<br>−31% | 65k<br>−34% |
| 2 | 5 | 101k | 100k<br>−1% | 98k<br>−3% | 98k<br>−3% | 98k<br>−3% |
| 3 | 10 | 108k | 105k<br>−3% | 103k<br>−5% | 101k<br>−6% | 101k<br>−6% |
| 4 | 0 | 112 | 84<br>−25% | 80<br>−29% | 75<br>−33% | 70<br>−38% |
| 5 | 5 | 103 | 101<br>−2% | 100<br>−3% | 99<br>−4% | 98<br>−5% |
| 6 | 10 | 130 | 125<br>−4% | 120<br>−8% | 119<br>−8% | 119<br>−8% |
| 7 | 0 | 10.2 | 15.0<br>47% | 16.8<br>5% | 19.8<br>94% | 19.8<br>94% |
| 8 | 5 | 9.5 | 9.3<br>−2% | 9.3<br>−2% | 9.3<br>−2% | 9.3<br>−2% |
| 9 | 10 | 8.6 | 8.5<br>−1% | 8.4<br>−1% | 8.4<br>−1% | 8.4<br>−1% |

In Table 3, the change ratio of sheet resistance (%) is a ratio of a change in sheet resistance before and after 100 pulse applications/sheet resistance before the 100 pulse applications×100, and $ZrO_2$ as added is by parts by weight of $ZrO_2$ as added per 100 parts by weight of the mixture of $LaB_6$ and glass powder.

TABLE 4

| Resistor No. | $ZrO_2$ as added | Temperature coefficient of resistivity (ppm/°C.) and change ratio of temperature coefficient of resistivity (%) — Number of pulse application: 0 | 100 | 1,000 | 5,000 | 10,000 |
|---|---|---|---|---|---|---|
| 1 | 0 | −121 | −56<br>54% | −50<br>59% | −45<br>63% | −45<br>63% |
| 2 | 5 | −98 | −95<br>3% | −94<br>4% | −95<br>3% | −97<br>1% |
| 3 | 10 | −130 | −135<br>−4% | −130<br>0% | −128<br>2% | −129<br>1% |
| 4 | 0 | −32 | +52<br>263% | +60<br>288% | +65<br>303% | +65<br>303% |
| 5 | 5 | −20 | −30<br>−50% | −26<br>−30% | −25<br>−25% | −26<br>−30% |
| 6 | 10 | −21 | −25<br>−19% | −26<br>−24% | −20<br>5% | −19<br>11% |
| 7 | 0 | +56 | +120 | +125 | +130 | +130 |

TABLE 4-continued

| Re-sis-tor No. | $ZrO_2$ as added | Temperature coefficient of resistivity (ppm/°C.) and change ratio of temperature coefficient of resistivity (%) | | | | |
|---|---|---|---|---|---|---|
| | | Number of pulse application | | | | |
| | | 0 | 100 | 1,000 | 5,000 | 10,000 |
| | | | 114% | 123% | 132% | 132% |
| 8 | 5 | +89 | +92 | +95 | +95 | +95 |
| | | | 3% | 7% | 7% | 7% |
| 9 | 10 | +101 | +111 | +112 | +111 | +105 |
| | | | 10% | 11% | 10% | 4% |

In Table 4, the change ratio of temperature coefficient of resistivity (%) is a ratio of a change in temperature coefficient of resistivity before and after 100 pulse applications/temperature coefficient of resistivity before the 100 pulse applications×100 and "$ZrO_2$ as added" is by parts by weight of $ZrO_2$ as added per 100 parts by weight of the mixture of $LaB_6$ and glass powder.

As is obvious from Table 3 and 4, the sheet resistance tended to lower after the pulse applications in the case of the resistors containing no $ZrO_2$ (Nos. 1, 4 and 7), whereas such a tendency was suppressed and the pulse resistance is increased in the case of the resistors containing $ZrO_2$. The temperature coefficient of resistivity was changed upon pulse application in the case of the resistors containing no $ZrO_2$, whereas the temperature coefficient of resistivity was stabilized with $ZrO_2$.

Then, the 9 kinds of the thick film resistors were left to stand in a vessel at a high temperature, i.e., 150° C. to investigate changes in the sheet resistance before and after leaving them to stand at the high temperature. The results are shown in the following Table 5.

TABLE 5

| | Sheet resistance (Ω/□) | | | | | | | | |
|---|---|---|---|---|---|---|---|---|---|
| Resistor No. | 1 | 2 | 3 | 4 | 5 | 6 | 7 | 8 | 9 |
| $ZrO_2$ as added | 0 | 5 | 10 | 0 | 5 | 10 | 0 | 5 | 10 |
| Sheet resistance before the test | 98k | 101k | 108k | 112 | 103 | 130 | 10.2 | 9.5 | 8.6 |
| Sheet resistance after the test | 120k | 103k | 108k | 151 | 104 | 129 | 20.2 | 9.2 | 8.9 |
| Change ratio of sheet resistance before and after the test (%) | 22% | 1.9% | 0% | 35% | 0.9% | −0.8% | 98% | 3.1% | 3.4% |

In Table 5, "$ZrO_2$ as added" is by parts by weight of $ZrO_2$ as added per 100 parts by weight of the mixture of $LaB_6$ and glass powder.

As is obvious from Table 5, the change ratio before and after the test was made smaller by adding $ZrO_2$ to the mixture and the reliability of the thick film resistors at a high temperature was improved.

Figure 2:
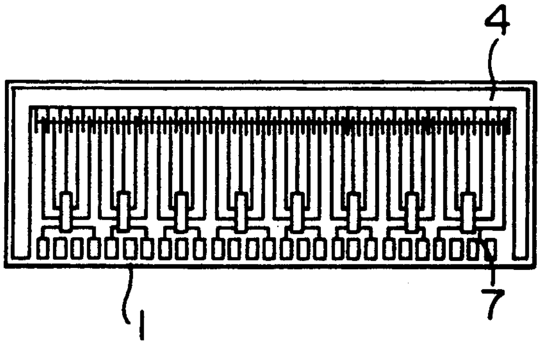
FIG. 2 shows a schematic structure of driver IC on which thermistors of the present invention are mounted.
Figure 3:
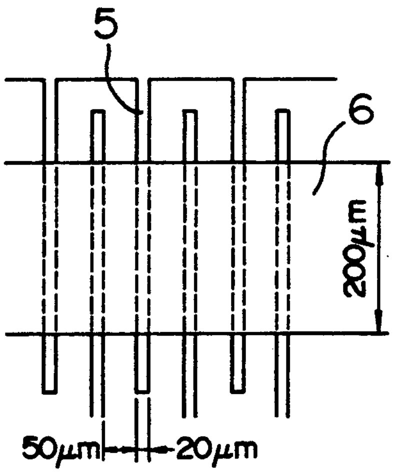
FIG. 3 shows an arrangement of copper electrodes and thermistors.

Resistor pastes Nos. 4, 5 and 6 were selected from the 9 kinds of the resistor pastes and printed on a glazed substrate 4 as a ceramic substrate, on which driver IC for a thermal head was mounted, as thermistors for the thermal head, as shown in FIG. 2, to form thermistors 6 together with copper electrodes 5 on the pattern, as shown in FIG. 3, and changes in the step stress characteristics (SST characteristics) of the respective thermistors 6 were investigated. The results are shown in Table 6.

In this test, it was necessary that there be no change in the sheet resistance of the thermistors for the thermal head even if a power load of up to 0.6 W/dot is applied thereto, and thus power loads capable of application of 0.2, 0.6, 0.8, 1.0 and 1.2 W/dot of the thermistor were used.

TABLE 6

| | ΔR/Ro | | |
|---|---|---|---|
| Resistor No. | 4 | 5 | 8 |
| $ZrO_2$ as added | 0 | 5 | 10 |
| Power load (W/dot) | | | |
| 0.2 | 0 | 0 | 0 |
| 0.4 | 5 | 0 | 0 |
| 0.6 | 19 | 2 | 1 |
| 0.8 | 30 | 3 | 3 |
| 1.0 | 45 | 2 | 2 |
| 1.2 | 60 | 5 | 2 |

In Table 6, Ro is a sheet resistance before the SST test, ΔR is a difference of the sheet resistance after the SST test minus the sheet resistance before the SST test, and "$ZrO_2$ as added" is by parts by weight per 100 parts by weight of the mixture of $LaB_6$ and glass powder.

As is obvious from Table 6, the sheet resistance started to change at about 0.4 W/dot in the case of the thermistor resistor containing no $ZrO_2$, whereas the sheet resistance was stable even by application of power load of 1.2 W/dot in the case of the thermistors containing $ZrO_2$. Thus, when the present thick film resistor composition containing $ZrO_2$ is used as a thermistor for a thermal head, the voltage to be applied to the thermistor can be increased with less change in the resistivity with time, and thus the images on the thermal sheets can be improved.

EXAMPLE 2

A process for producing electroconductive particles for a thick film resistor, using an arc plasma heat source, is shown below.

At first, $LaB_6$ particles having a particle size of a few μm (shown by 11B in FIG. 5), obtained by mechanical pulverization, were molded to a molding $LaB_6$, about 30 mm in diameter and 5 mm thick. An arc was generated between the molding of $LaB_6$ particles as a master material and a tungsten electrode to evaporate $LaB_6$ in the thus generated plasma heat source. The evaporated $LaB_6$ was quenched and trapped, whereby ultra fine $LaB_6$ particles having a particle size of not more than 0.1 μm (shown by 11A in FIG. 4) were obtained. The atmosphere gas used was Ar+50% $H_2$ and an electrical signal of 40 V and 150 A was applied between the electrode and the master material.

Figure 4:
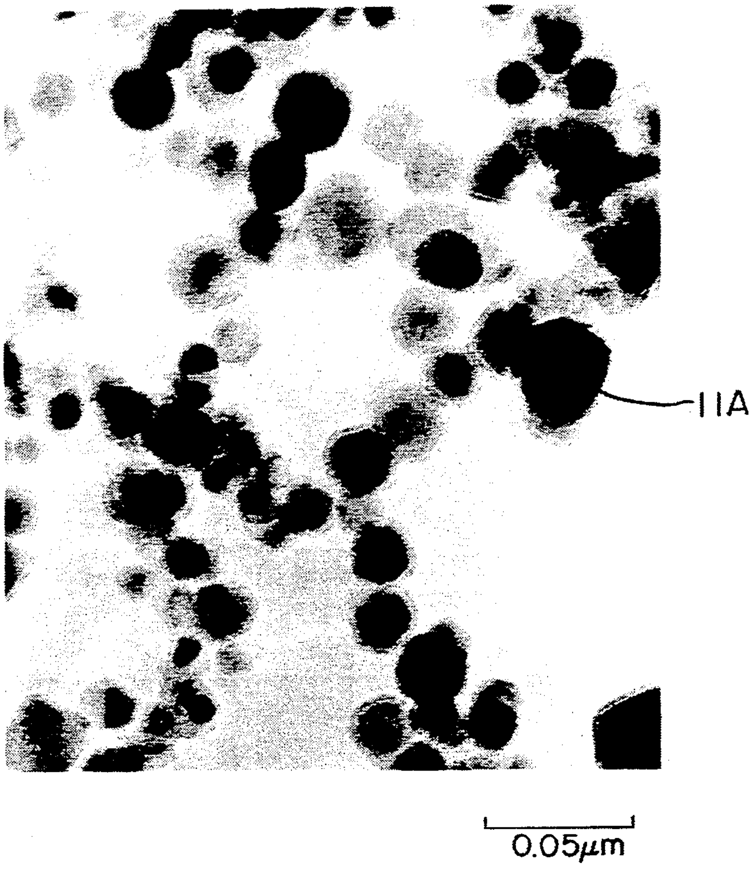
FIG. 4 is a transmission-type electron microscope picture of ultra fine $LaB_6$ particles obtained by using a plasma heat source.
Figure 5:
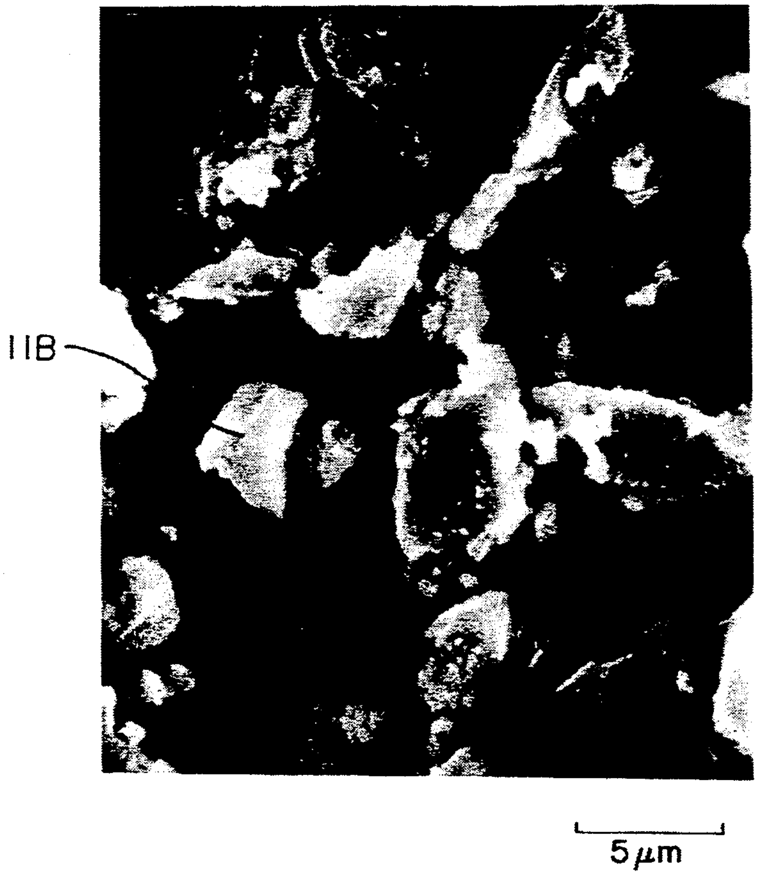
FIG. 5 is a scanning-type electron microscope picture of $LaB_6$ particles obtained by mechanical pulverization.

The transmission-type electron microscope picture of the thus obtained ultra fine $LaB_6$ particles is shown in FIG. 4 and the scanning type, electron microscope picture of $LaB_6$ particles as the raw material is shown in FIG. 5.

Glass powder for mixing with the ultra fine $LaB_6$ particles was formed as follows. The following oxides were weighed out in the following amounts and mixed together.

| | |
|---|---|
| $SiO_2$: | 45.1% by mole |
| $B_2O_3$: | 34.8% by mole |
| $Al_2O_3$: | 7.8% by mole |
| CaO: | 12.3% by mole |

The mixture was melted in a platinum crucible at about 1,500° C. and then the molten mixture was poured into cold water for solidification. Then, the solidified mixture was pulverized and made into frits to form glass powder.

The thus obtained glass powder and the ultra fine $LaB_6$ particles were mixed in a grinding mill and about 20% by weight of an acrylic resin/butylcarbitol acetate solution, based on the powdery components, was added thereto as an organic vehicle. Then, the mixture was kneaded through three rolls at room temperature to form a paste of thick film resistor composition.

A thick film resistor was prepared from the thick film resistor composition in the following manner.

As shown in FIG. 1, Cu electrodes were formed from a Cu-based paste 2 containing 95 to 99 wt. % of Cu and 5 to 1 wt. % of glass, preferably 99 wt. % of Cu and 2 wt. % of glass on an alumina substrate 1, preferably a 96 wt. % alumina substrate by screen printing. Then, the alumina substrate 1 was dried at 120° C. for 10 minutes and then fired in a $N_2$ gas at 900° C. for 10 minutes. Then, the thick film resistor composition was printed on the alumina substrate 1 to form green thick film resistors. Then, the alumina substrate 1 was dried at 120° C. for 10 minutes and then fired in a $N_2$ gas at 900° C. for 10 minutes to form thick film resistors 3.

Results of measuring the characteristics of 10 kinds of thick film resistors 3 having different electroconductive phase and glass phase compositions among the thick film resistors 3 thus obtained are shown in the following Table 7, where the temperature coefficient of resistivity (TCR) was calculated according to the following equation:

$$TCR\ (\text{ppm/°C.}) = \frac{\{R(125) - R(25)\}}{R(25) \cdot 100} \times 10^6$$

wherein R(T) is a resistivity at T° C., and the fluctuation in the sheet resistance was calculated from a ratio of the standard deviation $\sigma$ to the average sheet resistance of 20 thick film resistors.

TABLE 7

| Resistor No. | $LaB_6$ (vol %) | Glass (vol %) | Sheet resistance (Ω/□) | Temperature coefficient of resistivity (ppm/°C.) | Fluctuations in sheet resistance (σ/R) | Current noise level (dB) |
|---|---|---|---|---|---|---|
| 1 | 50.1 | 49.9 | 8.6 | +220 | 0.13 | −24 |
| 2 | 42.3 | 57.7 | 45.6 | +131 | 0.14 | −22 |
| 3 | 32.1 | 67.9 | 102.5 | +102 | 0.12 | −27 |
| 4 | 29.4 | 70.6 | 327.6 | +64 | 0.14 | −21 |
| 5 | 25.6 | 74.4 | 940.5 | +20 | 0.13 | −13 |
| 6 | 20.4 | 79.6 | 3.5K | −34 | 0.12 | −11 |
| 7 | 17.9 | 82.1 | 53.9K | −138 | 0.11 | −13 |
| 8 | 14.3 | 85.7 | 205.6K | −165 | 0.15 | −16 |
| 9 | 9.5 | 90.5 | 1.5M | −190 | 0.17 | −14 |
| 10 | 5.1 | 94.9 | 7.5M | −239 | 0.21 | −12 |

As is obvious from Table 7, resistors having a sheet resistance ranging from a lower to a higher sheet resistance and also a temperature coefficient of resistivity within a range of ±300 ppm/°C. could be obtained. By changing the mixing ratio of the ultra fine $LaB_6$ particles to the glass powder, thick film resistors having a desirable sheet resistance of 10 to 1 M Ω/□ could be obtained.

EXAMPLE 3

Another process for producing electroconductive particles for a thick film resistor, using a RF induction plasma heat source is shown below.

At first, the condition for electrical signal to be applied to an RF induction coil was set to 10 KV-1A and an atmosphere gas of Ar+He was brought into a plasma state in the RF induction coil to generate a plasma in the RF induction coil. Then, $LaB_6$ particles having a particle size of a few μm obtained by mechanical pulverization were injected into the plasma region, whereby the $LaB_6$ was instantaneously evaporated in the plasma. The evaporated $LaB_6$ was immediately cooled and solidified as soon as the evaporated $LaB_6$ left the plasma region, thereby forming ultra fine $LaB_6$ particles having a particle size of not more than 0.1 μm.

The ultra fine $LaB_6$ particles obtained with the RF induction plasma heat source was mixed with the same glass powder and then with the same organic vehicle in the same manner as in Example 2 to prepare thick film resistor compositions. Then, the thick film resistors were prepared from the thick film resistor compositions by firing in the same manner as in Example 2.

Results of measuring various characteristics of the thus obtained 10 thick film resistors are shown in Table 8.

TABLE 8

| Resistor No. | $LaB_6$ (vol %) | Glass (vol %) | Sheet resistance (Ω/□) | Temperature coefficient of resistivity (ppm/°C.) | Fluctuation in sheet resistance (σ/R) | Current noise level (dB) |
|---|---|---|---|---|---|---|
| 1 | 50.3 | 49.7 | 7.5 | +231 | 0.14 | −21 |
| 2 | 45.3 | 54.7 | 47.6 | +142 | 0.12 | −17 |
| 3 | 32.7 | 67.3 | 104.1 | +122 | 0.11 | −21 |
| 4 | 25.4 | 74.6 | 361.6 | +62 | 0.14 | −24 |
| 5 | 21.6 | 78.4 | 944.2 | +31 | 0.18 | −17 |
| 6 | 22.4 | 77.6 | 4.5K | −65 | 0.14 | −14 |
| 7 | 17.7 | 82.3 | 54.9K | −178 | 0.14 | −11 |
| 8 | 14.6 | 85.4 | 241.6K | −178 | 0.12 | −14 |
| 9 | 11.5 | 88.5 | 1.7M | −292 | 0.11 | −12 |
| 10 | 5.5 | 94.5 | 5.6M | −249 | 0.21 | −8 |

As is obvious from Table 8, thick film resistors having a desired sheet resistance of 10 to 1 M Ω/□ and also a temperature coefficient of resistivity within a range of ±300 ppm/°C. could be obtained, as in Example 2.

In order to make comparison of the present thick film resistors with the conventional thick film resistors using $LaB_6$ particles obtained by mechanical pulverization, results of measuring various characteristics of the conventional thick film resistors are shown in Table 9.

TABLE 9

| Resistor No. | $LaB_6$ (vol %) | Glass (vol %) | Sheet resistance (Ω/□) | Temperature coefficient of resistivity (ppm/°C.) | Fluctuation in sheet resistance (σ/R) | Current noise level (dB) |
|---|---|---|---|---|---|---|
| 1 | 50.4 | 49.6 | 9.6 | +250 | 0.13 | −24 |
| 2 | 42.6 | 57.4 | 47.6 | +138 | 0.13 | 19 |

TABLE 9-continued

| Resistor No. | $LaB_6$ (vol %) | Glass (vol %) | Sheet resistance (Ω/□) | Temperature coefficient of resistivity (ppm/°C.) | Fluctuation in sheet resistance (σ/R) | Current noise level (dB) |
|---|---|---|---|---|---|---|
| 3 | 32.2 | 67.8 | 102.5 | −280 | 0.56 | −9 |
| 4 | 27.4 | 72.6 | 927.7 | −1564 | 5.14 | 21 |
| 5 | 25.8 | 74.2 | 12.5K | −2305 | 7.13 | 43 |
| 6 | 20.9 | 79.1 | ∞ | — | — | — |
| 7 | 15.9 | 84.1 | ∞ | — | — | — |

As is obvious from Table 9, thick film resistors Nos. 6 and 7 of the 7 kinds of conventional thick film resistors had a higher sheet resistance than the resistance range for the measurement by a digital multimeter and thus had substantially the same property as that of an insulator. The sheet resistance of the conventional thick film resistors was maximum 12.5 KΩ/□ even by changing the mixing ratio of $LaB_6$ to glass powder, and the desirable sheet resistance of up to 1 MΩ/□ as the thick film resistor could not be obtained. The temperature coefficient of resistivity of thick film resistors Nos. 4 and 5 was far over the allowable range of ±300 ppm, which was desirable for the thick film resistor.

Higher current noise level of the thick film resistors than those of the thick film resistors shown in Table 7 and 8 were due to the unevenness of particulate shape That is, the $LaB_6$ particles obtained by mechanical pulverization had a considerably rugged surface shape, as shown in FIG. 5, and thus the contact between the particles was unstable when the electroconductive particles are combined together in the resistor, generating current noises.

Figure 6:
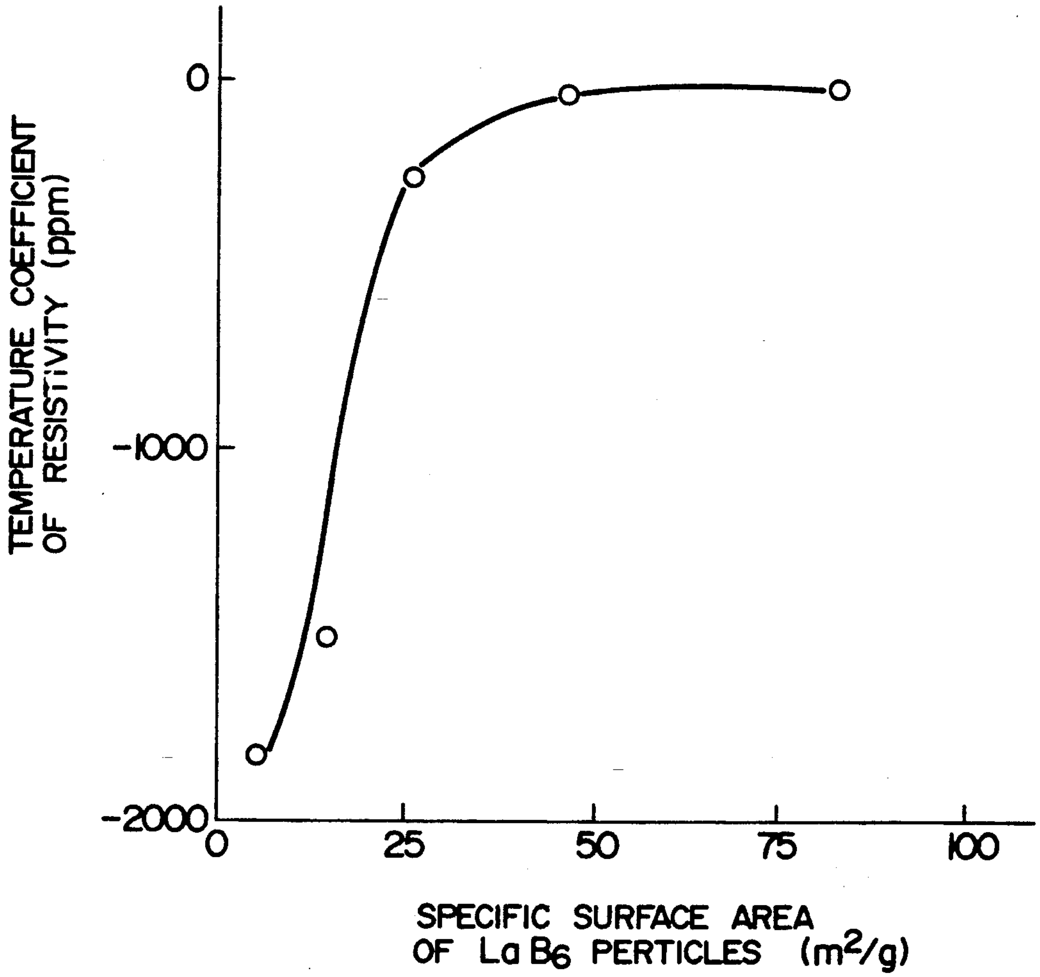
FIG. 6 is a characteristic diagram showing relations between the specific surface area of $LaB_6$ particles and the temperature coefficient of resistivity.

In order to investigate the influence of particle size upon the resistance characteristics of thick film resistors, two kinds of thick film resistors based on $LaB_6$ obtained by mechanical pulverization, one kind of thick film resistor based on $LaB_6$ formed with the RF induction plasma heat source and two kinds of thick film resistors based on $LaB_6$ formed with the arc plasma heat source were used, where the sheet resistance and the temperature coefficient of resistivity of these thick film resistors were measured. The results are shown in Table 10. The temperature coefficient of resistivity depended on the sheet resistance, and thus relations between the specific surface area and the temperature coefficient of thick film resistors having a sheet resistance of about 1 KΩ/□ are shown in FIG. 6, where, to obtain particles of different specific surface areas by mechanic pulverization, those obtained by pulverization in a vibration mill were used and, to obtain particles of different specific surface areas with the arc plasma heat source, electrical signal condition was also changed.

TABLE 10

| Resistor No. | Method for preparing $LaB_6$ particles | Specific surface area ($m^2/g$) | Sheet resistance (Ω/□) | Temperature coefficient of resistivity (ppm/°C.) |
|---|---|---|---|---|
| 1 | Mechanical pulverization | 5.4 | 980.4 | −1,820 |
| 2 | Mechanical pulverization | 14.5 | 1,020.6 | −1,510 |
| 3 | RF induction plasma heat source | 26.1 | 994.5 | −260 |
| 4 | Arc plasma heat source | 46.5 | 982.2 | −45 |
| 5 | Arc plasma heat source | 83.0 | 993.5 | −31 |

As is obvious from Table 10, the temperature coefficient of resistivity was outside the allowable range of ±300 ppm/°C. in case of thick film resistors based on $LaB_6$ particles obtained by mechanical pulverization and was within the allowable range of ±300 ppm/°C. in the case of thick film resistors based on $LaB_6$ particles formed with the RF induction plasma heat source or the arc plasma heat source.

As is obvious from FIG. 6, even the $LaB_6$ particles formed by the plasma heat source must have a specific surface area of 25 $m^2/g$ or more, preferably 35 $m^2/g$ or more to obtain a temperature coefficient of resistivity within the allowable range of ±300 ppm/°C.

Figure 7:
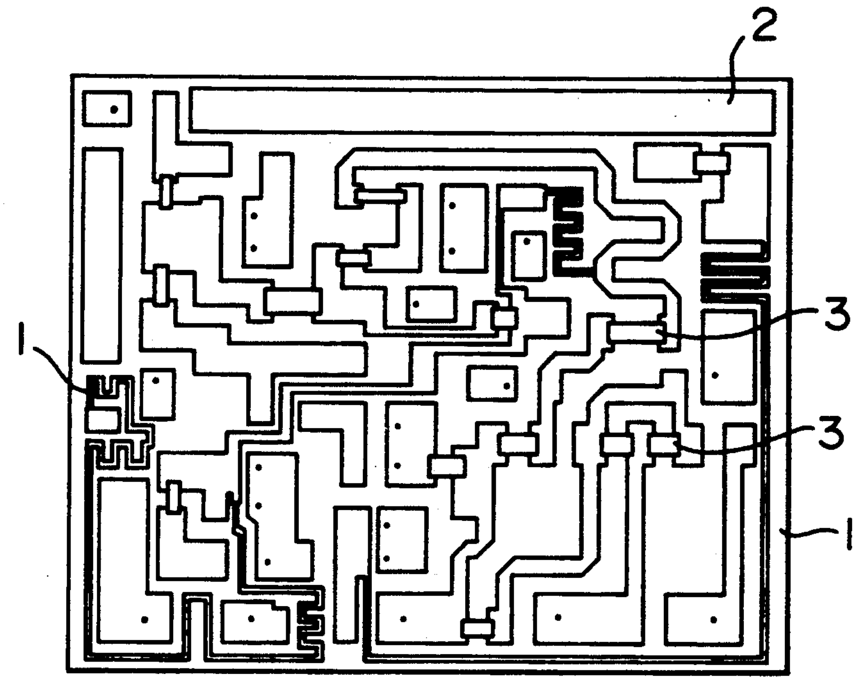
FIG. 7 shows a schematic structure of hybrid IC using thick film resistors containing $LaB_6$ formed by using a plasma heat source.

As shown in FIG. 7, thick film hybrid ICs for RF amplifier circuit as one example of semiconductor devices were formed with 5 kinds of thick film resistors Nos 2, 4, 5, 6 and 8 of Table 7 as thick film resistors 3 each on an alumina substrate 1 upon formation of a Cu conductor 2, and current noise levels were measured. It was found that the noise level due to the current noise level was low, and also that the fluctuation in the sheet resistance of the respective thick film resistors was low. Thus, the present thick film resistors had resistance characteristics suitable for the circuit design.

EXAMPLE 4

An embodiment of Cu-based hybrid IC in combination of the present thick film resistor with a Cu conductor is given below.

The resistance matrix circuit necessary for separation of stereo sound and color reproduction of video signals requires resistors of high precision. For example, the relationship between the degree of separation of stereo sound and the resistance precision can be given by the following equation.

$$S = 20 \log \frac{1+\alpha}{1-\alpha} \text{ (dB)}$$

wherein S is degree of separation and $\alpha$ is a resistance precision. The degree of separation of stereo sound to the left side and the right side generally requires 40 dB or more. In the case the resistance precision is −1%, $1+\alpha=0.99$ and thus S is 46 dB. In order to obtain a degree of separation of 40 dB or more, a resistance precision within the range of ±1% is required.

Figure 9:
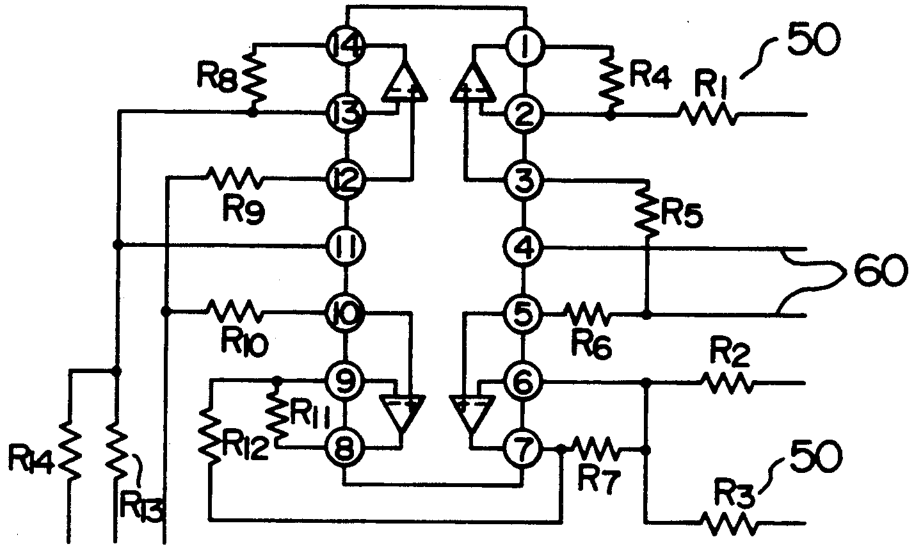
FIG. 9 shows a circuit diagram of resistor matrix circuit as a base for the circuit pattern of FIG. 8.

FIG. 9 shows a circuit diagram of resistance matrix circuit for treating the stereo sound. To attain the aforementioned degree of separation, the resistance precision each of $R_1$, $R_2$, $R_3$, $R_4$, $R_7$, $R_8$, $R_{11}$, $R_{12}$, $R_{13}$ and $R_{14}$ must be within the range of ±1%. Thus, thick film resistors based on the ultra fine $LaB_6$ particles prepared according to the present process are used for these resistors.

Figure 8:
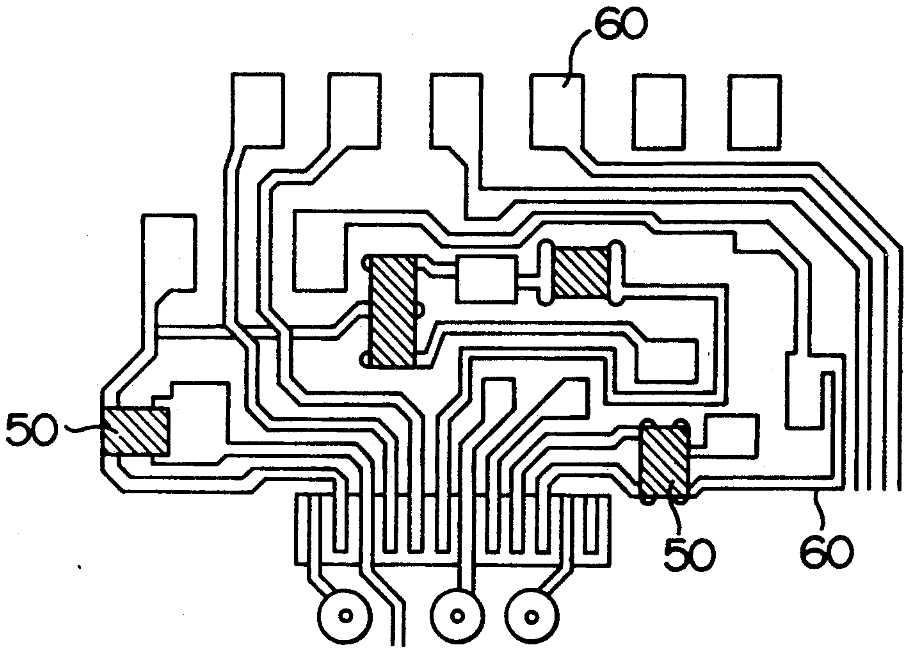
FIG. 8 shows a schematic structure in part of a circuit pattern, where the resistor matrix circuit is made from hybrid IC.

FIG. 8 is part of hybrid IC circuit pattern of the matrix circuit, where Cu is used as conductors. The resistors which have so far satisfied the circuit are only $RuO_2$-glass-based resistors, and thus the circuit has been made of the Ag-Pd conductors and $RuO_2$-glass-based resistors.

In the present invention, resistors 50 of high precision with less fluctuation in the resistivity to be combined with Cu conductors 60 can be realized, and thus the matrix circuit can be realized with the Cu-based hybrid IC.

EXAMPLE 5

Figure 10:
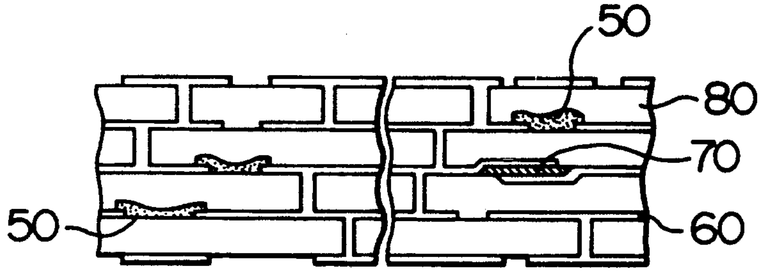
FIG. 10 shows a cross-sectional structure of a three-dimensional, multi-layered hybrid IC having resistors and condensers at the inside.
Figure 11:
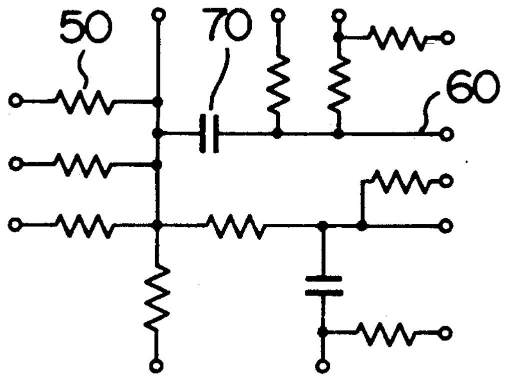
FIG. 11 shows a circuit diagram of an active filter based of a combination of the resistors and the condensers as a base for FIG. 8.

An embodiment of applying thick film resistors of the present invention to inner layer resistors in a three-dimensional, multi-layered hybrid IC using Cu as conductor circuits, which can be fired at a low temperature, is shown. The circuit is an example of an active filter based on a combination of resistors 50 and condensers 70 as shown in FIG. 10, where 10 resistors 50 and 2 condensers 70 are used. The density of these passive components can be increased by providing them within the multi-layered board.

The preparation is carried out in the following manner. At first, a green sheet is prepared from a combination of alumina and borosilicate glass capable of firing at 900° C. together with Cu. Holes are prepared on the green sheet, and then Cu conductors 60, resistors 50 and dielectric material 70 are successively printed on the green sheet. As the resistors, thick film resistors having a sheet resistance of 30 to 10 KΩ/□ after firing according to the present invention are used.

FIG. 10 is a cross-sectional multi-layered structure in part of the active filter thus prepared, wherein numeral 80 is an alumina-borosilicate substrate. An active filter of high precision with circuit characteristics can be obtained with less fluctuation in the resistivity.

What is claimed is:

1. A semiconductor device, which comprises a ceramic substrate, a semiconductor element, a thick film conductor, and a thick film resistor electrically connected to the thick film conductor; the semiconductor element, the thick film conductor and the thick film resistor being formed on the ceramic substrate, wherein the thick film resistor is made of a glass matrix and has particles of a metal boride dispersed in the glass matrix, the particles having a particle size of 0.005 to 0.1 μm and are particles formed by vapor phase solidification.

2. A semiconductor device, which comprises a ceramic substrate, a semiconductor element, a thick film Cu conductor, and a thick film resistor electrically connected to the thick film Cu conductor; the semiconductor element, the thick film cu conductor and the thick film resistor being formed on the ceramic substrate, wherein the thick film resistor is made of a glass matrix and has particles of a metal boride dispersed in the glass matrix, the particles having a particle size of 0.005 to 0.1 μm and are particles formed by vapor phase solidification.

3. A semiconductor device, which comprises a ceramic substrate, a semiconductor element, a thick film Cu conductor and a thick film resistor electrically connected to the thick film Cu conductor; the semiconductor element, the thick film Cu conductor and the thick film resistor being formed on the ceramic substrate, wherein the thick film resistor is made of a glass matrix and has particles of $LaB_6$ dispersed in the glass matrix, the particles having a particle size of 0.005 to 0.1 μm and are particles formed by vapor phase solidification.

4. A semiconductor device, which comprises a ceramic substrate, a semiconductor element, a thick film conductor and a thick film resistor electrically connected to the thick film conductor; the semiconductor element, the thick film conductor and the thick film resistor being formed on the ceramic substrate, wherein the thick film resistor contains a mixture of $LaB_6$ particles having a particle size of 0.005 to 0.1 μm as an electroconductive material and glass powder, the glass powder being capable of being fired in a nonoxidative atmosphere without any reduction with the $LaB_6$ particles, the $LaB_6$ particles being particles formed by vapor phase solidification.

5. A semiconductor device, which comprises a ceramic substrate, a semiconductor element, a thick film Cu conductor and a thick film resistor electrically connected to the thick film Cu conductor, the semiconductor element, the thick film Cu conductor and the thick film resistor being formed on the ceramic substrate; the thick film resistor containing a mixture of $LaB_6$ particles having a particle size of 0.005 to 0.1 μm as an electroconductive material and glass powder and the glass powder being capable of being fired in a nonoxidative atmosphere without any reduction with the $LaB_6$ particles, the $LaB_6$ particles being particles formed by vapor phase solidification.

6. A semiconductor device, which comprises a ceramic substrate, a semiconductor element, a thick film conductor and a thick film resistor electrically connected to the thick film conductor; the semiconductor element, the thick film conductor and the thick film resistor being formed on the ceramic substrate; the thick film resistor containing a mixture of $LaB_6$ particles having a particle size of 0.005 to 0.1 μm as an electroconductive material and glass powder composed substantially of 30–50 wt. % $SiO_2$, 5–40 wt. % $B_2O_3$, 5–30 wt. % CaO and 5–20 wt. % $Al_2O_3$ and the glass powder being capable of being fired in a nonoxidative atmosphere without any reduction with the $LaB_6$ particles, the $LaB_6$ particles being particles formed by vapor phase solidification.

7. A semiconductor device, which comprises a ceramic substrate, a semiconductor element, a thick film Cu conductor and a thick film resistor electrically connected to the thick film Cu conductor; the semiconductor element, the thick film Cu conductor and the thick film resistor being formed on the ceramic substrate; the thick film resistor containing a mixture of $LaB_6$ particles having a particle size of 0.005 to 0.1 μm as an electroconductive material and glass powder composed substantially of 30–50 wt. % $SiO_2$, 5–40 wt. % $B_2O_3$, 5–30 wt. % CaO and 5–20 wt. % $Al_2O_3$ and the glass powder being capable of being fired in a nonoxidative atmosphere without any reduction with the $LaB_6$ particles, the $LaB_6$ particles being particles formed by vapor phase solidification.

8. A thick film resistor composition, which comprises metal boride particles, having a particle size of at most 0.1 μm, obtained by vapor phase solidification; glass powder; and an organic vehicle.

9. A thick film resistor composition, which comprises metal boride particles, having a particle size of at most 0.1 μm, obtained by vapor phase solidification; glass powder; and an organic vehicle, the glass powder being capable of being fired in a nonoxidative atmosphere without any reduction with the metal boride particles.

10. A thick film resistor composition, which comprises metal boride particles, having a particle size of at most 0.1 μm, obtained by vapor phase solidification, glass powder composed substantially of 30–50 wt. % $SiO_2$, 5–40 wt. %, $B_2O_3$, 5–30 wt. % CaO and 5–20 wt. % $Al_2O_3$, and an organic vehicle.

11. A thick film resistor composition, which comprises metal boride powder, having a particle size of 0.005 to 0.1 μm and a specific surface area of 25 $m^2/g$ or more, obtained by vapor phase solidification, as an electroconductive material, glass powder and an organic vehicle.

12. A thick film resistor composition, which comprises metal boride particles having a substantially spherical shape, and having a particle size of at most 0.1 μm, obtained by vapor phase solidification, as an electroconductive material, glass powder and an organic vehicle.

13. A thick film resistor composition, which comprises (1) powder of at least one metal boride, the metal of the metal boride being selected from the group consisting of an element belonging to the IV, V, VI, VII and VIII groups and rare earth elements of the periodic table, the powder of at least one metal boride having a particle size of at most 0.1 μm, obtained by vapor phase solidification, (2) glass powder, said glass powder being capable of being fired in a nonoxidative atmosphere without any reduction with the metal boride powder, (3) at least one oxide selected from the group consisting of $ZrO_2$, $HfO_2$, $Y_2O_3$, $La_2O_3$ and $Th_2O_3$, and (4) an organic vehicle.

14. A thick film resistor composition, which comprises (1) powder of at least one metal boride, the metal of the metal boride being selected from the group consisting of an element belonging to the IV, V, VI, VII and VIII groups and rare earth elements of the periodic table, said powder of at least one metal boride being obtained by vapor phase solidification, and having a particle size of at most 0.1 μm, (2) glass powder, said glass powder being capable of being fired in a nonoxidative atmosphere without any reduction with the metal boride powder, (3) at least one oxide selected from the group consisting of $ZrO_2$, $HfO_2$, $Y_2O_3$, $La_2O_3$ and $Th_2O_3$, and (4) an organic vehicle.

15. A thick film resistor composition according to claim 14, wherein 1 to 40 parts by weight of the at least one oxide is contained per 100 parts by weight of sum total of the metal boride powder and the glass powder.

16. A thick film resistor composition according to claim 15, wherein the metal boride powder is $LaB_6$ powder and the oxide is $ZrO_2$.

17. An electronic device which comprises resistance matrix circuits for separation of stereo sound and color reproduction of video signals, at least one of the resistance matrix circuits comprising a thick film hybrid IC having a thick film conductor and a thick film resistor on a ceramic substrate, the thick resistor being made of a glass matrix and metal boride particles, having a particle size of at most 0.1 μm, dispersed in the glass matrix, the metal boride particles being obtained by vapor phase solidification.

18. A thermal head, which comprises a ceramic substrate, a conductor, an exothermic resistor and an electrode; the conductor, the exothermic resistor and the electrode being formed on the ceramic substrate; the conductor being a Cu conductor, the exothermic resistor being made of a glass matrix having metal boride particles, having a particle size of at most 0.1 μm, dispersed in the glass matrix, the metal boride particles being obtained by vapor phase solidification, and the electrode being a Cu electrode.

19. The semiconductor device according to claim 1, wherein the metal boride is at least one selected from the group consisting of titanium boride, tungsten boride, manganese boride and cobalt boride.

20. A thick film resistor composition according to claim 13, wherein the at least one oxide is selected from the group consisting of $ZrO_2$, $Y_2O_3$, $La_2O_3$ and $Th_2O_3$.

21. A thick film resistor composition according to claim 14, wherein the at least one oxide is selected from the group consisting of $ZrO_2$, $Y_2O_3$, $La_2O_3$ and $Th_2O_3$.

22. A thick film resistor composition according to claim 13, wherein the glass powder is composed substantially of 30–50 wt. % $SiO_2$, 5–40 wt. % $B_2O_3$, 5–30 wt. % CaO and 5–20 wt. % $Al_2O_3$.

23. A thick film resistor composition according to claim 8, wherein the metal boride particles have a particle size of 0.005 to 0.1 μm.

24. A thick film resistor composition according to claim 9, wherein the metal boride particles have a particle size of 0.005 to 0.1 μm.

25. A thick film resistor composition according to claim 10, wherein the metal boride particles have a particle size of 0.005 to 0.1 μm.

26. A thick film resistor composition according to claim 12, wherein the metal boride particles have a particle size of 0.005 to 0.1 μm.

27. A semiconductor device according to claim 1, wherein said particles consist of said metal boride.

28. A thick film resistor composition according to claim 8, wherein the metal boride particles consist of the metal boride.

29. A thick film resistor composition according to claim 11, wherein the metal boride powder has a specific surface area of 35 $m^2/g$ or more.

30. An electronic device according to claim 17, wherein the metal boride particles have a particle size of 0.005 to 0.1 μm.

31. A thermal head according to claim 18, wherein the metal boride particles have a particle size of 0.005 to 0.1 μm.

32. A semiconductor device according to claim 1, wherein the particles of a metal boride have a specific surface area of at least 25 $m^2/g$.

33. A semiconductor device according to claim 1, wherein the vapor phase solidification, by which the particles are formed, include evaporation of metal boride by exposing the metal boride to heat energy from a plasma heat source and then quenching to form the particles of the metal boride.

34. A semiconductor device according to claim 3, wherein the particles of a metal boride have a specific surface area of at least 25 $m^2/g$.

35. A thick film resistor composition according to claim 8, wherein the vapor phase solidification, by which the particles are formed, include evaporation of metal boride by exposing the metal boride to heat energy from a plasma heat source and then quenching to form the particles of the metal boride.

36. A thick film resistor composition according to claim 8, wherein the metal boride particles have a specific surface area of at least 25 $m^2/g$.

37. A semiconductor device, which comprises a ceramic substrate, a semiconductor element, a thick film conductor, and a thick film resistor electrically connected to the thick film conductor; the semiconductor element, the thick film conductor and the thick film resistor being formed on the ceramic substrate, wherein the thick film resistor is made of a glass matrix and has particles of a metal boride dispersed in the glass matrix, the particles having a particle size of 0.005 to 0.1 μm and having a substantially spherical shape.

38. A semiconductor device according to claim 37, wherein the particles of a metal boride have a specific surface area of at least 25 $m^2/g$.

39. A semiconductor device, which comprises a ceramic substrate, a semiconductor element, a thick film Cu conductor and a thick film resistor electrically connected to the thick film Cu conductor; the semiconductor element, the thick film Cu conductor and the thick film resistor being formed on the ceramic substrate, wherein the thick film resistor is made of a glass matrix and has particles of $LaB_6$ dispersed in the glass matrix, the particles having a particle size of 0.005 to 0.1 μm and having a substantially spherical shape.

40. A thick film resistor composition, which comprises metal boride particles, having a particle size of at most 0.1 μm, obtained by vapor phase solidification, and having a substantially spherical shape; glass powder; and an organic vehicle, the glass powder being capable of being fired in a nonoxidative atmosphere without any reduction with the metal boride particles.

41. A semiconductor device according to claim 40, wherein the particles of a metal boride have a specific surface area of at least 25 $m^2/g$.

42. A thick film resistor composition, which comprises (1) powder of at least one metal boride, the metal of the at least one metal boride being selected from the group consisting of an element belonging to the IV, V, VI, VII and VIII groups and rare earth elements of the periodic table, the powder of the at least one metal boride having a substantially spherical shape, (2) glass powder, said glass powder being capable of being fired in a nonoxidative atmosphere without any reduction with the metal boride powder, (3) at least one oxide selected from the group consisting of $ZrO_2$, $HfO_2$, $Y_2O_3$ and $Th_2O_3$, and (4) an organic vehicle.

43. An electronic device which comprises resistance matrix circuits for separation of stereo sound and color reproduction of video signals, at least one of the resistance matrix circuits comprising a thick film hybrid IC having a thick film conductor and a thick film resistor on a ceramic substrate, the thick film resistor being made of a glass matrix and metal boride particles, having a particle size of at most 0.1 μm, and having a substantially spherical shape, dispersed in the glass matrix, the metal boride particles being obtained by vapor phase solidification.

44. A thermal head, which comprises a ceramic substrate, a conductor, an exothermic resistor and an electrode; the conductor, the exothermic resistor and the electrode being formed on the ceramic substrate; the conductor being a Cu conductor, the exothermic resistor being made of a glass matrix having metal boride particles, the metal boride particles having a particle size of at most 0.1 μm, and having a substantially spherical shape, dispersed in the glass matrix, the metal boride particles being obtained by vapor phase solidification, and the electrode being a Cu electrode.

* * * * *